United States Patent
Chen et al.

(10) Patent No.: US 10,192,804 B2
(45) Date of Patent: Jan. 29, 2019

(54) BUMP-ON-TRACE PACKAGING STRUCTURE AND METHOD FOR FORMING THE SAME

(75) Inventors: Meng-Tse Chen, Changzhi Township (TW); Wei-Hung Lin, Xinfeng Township (TW); Chih-Wei Lin, Xinfeng Township (TW); Kuei-Wei Huang, Hsinchu (TW); Hui-Min Huang, Taoyuan (TW); Ming-Da Cheng, Jhubei (TW); Chung-Shi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 13/544,783

(22) Filed: Jul. 9, 2012

(65) Prior Publication Data

US 2014/0008786 A1 Jan. 9, 2014

(51) Int. Cl.
*H01L 29/49* (2006.01)
*H01L 23/31* (2006.01)
*H01L 23/00* (2006.01)
*H01L 23/498* (2006.01)

(52) U.S. Cl.
CPC .... *H01L 23/3157* (2013.01); *H01L 23/49816* (2013.01); *H01L 24/13* (2013.01); *H01L 24/16* (2013.01); *H01L 24/81* (2013.01); *H01L 2224/10175* (2013.01); *H01L 2224/1146* (2013.01); *H01L 2224/11849* (2013.01); *H01L 2224/13082* (2013.01); *H01L 2224/13111* (2013.01); *H01L 2224/13147* (2013.01); *H01L 2224/16238* (2013.01); *H01L 2224/73204* (2013.01); *H01L 2224/81191* (2013.01); *H01L 2224/81385* (2013.01); *H01L 2224/81815* (2013.01); *H01L 2924/12042* (2013.01); *H01L 2924/15311* (2013.01)

(58) Field of Classification Search
CPC ... H01L 23/49816; H01L 24/13; H01L 24/16; H01L 2224/13082
USPC .................... 257/737, 779, E21.48
See application file for complete search history.

(56) References Cited

U.S. PATENT DOCUMENTS

| | | | | |
|---|---|---|---|---|
| 4,908,096 A | * | 3/1990 | Zupancic | G03F 7/038 216/49 |
| 7,642,135 B2 | * | 1/2010 | Liang | 438/113 |
| 8,669,137 B2 | * | 3/2014 | Nah et al. | 438/108 |
| 2002/0034872 A1 | * | 3/2002 | Kazama | H01L 23/3114 438/613 |
| 2003/0218250 A1 | * | 11/2003 | Kung et al. | 257/737 |

(Continued)

*Primary Examiner* — Michael Shingleton
(74) *Attorney, Agent, or Firm* — Slater Matsil, LLP

(57) ABSTRACT

A device comprises a first package component, and a first metal trace and a second metal trace on a top surface of the first package component. The device further includes a dielectric mask layer covering the top surface of the first package component, the first metal trace and the second metal trace, wherein the dielectric mask layer has an opening therein exposing the first metal trace. The device also includes a second package component and an interconnect formed on the second package component, the interconnect having a metal bump and a solder bump formed on the metal bump, wherein the solder bump contacts the first metal trace in the opening of the dielectric mask layer.

19 Claims, 3 Drawing Sheets

(56) References Cited

U.S. PATENT DOCUMENTS

| | | | |
|---|---|---|---|
| 2005/0275096 A1* | 12/2005 | Zeng | B23K 35/262 257/737 |
| 2009/0091027 A1* | 4/2009 | Fan | H01L 25/105 257/737 |
| 2009/0250811 A1* | 10/2009 | Pendse | H01L 21/563 257/737 |
| 2011/0241193 A1* | 10/2011 | Ding et al. | 257/686 |
| 2012/0006592 A1* | 1/2012 | Ouchi et al. | 174/267 |

* cited by examiner

BUMP-ON-TRACE PACKAGING STRUCTURE AND METHOD FOR FORMING THE SAME

BACKGROUND

Bump-on-Trace (BOT) structures are used in flip chip packages, where metal bumps are bonded onto metal traces in package substrates directly, rather than bonded onto metal pads in conventional package bonding schemes. The BOT structures facilitate smaller chip areas, and the manufacturing cost of the BOT structures is lower compared to conventional package bonding schemes. The BOT structures achieve substantially the same reliability as the conventional bond structures that are based on metal pads.

When using a BOT structure, the metal bumps are soldered onto the metal traces on the package substrate by a reflow process. However, the metal bumps are typically wider than the metal traces, and hence the solder bonding the metal bumps to the metal traces may shift. Several problems may result from the metal bump shift. For example, solder bumps may crack, or may bridge to neighboring metal traces, especially at the minimum bump to trace location causing device failure. Further, the solder bumps may shift and bridge to neighboring metal traces due to the coefficient of thermal expansion (CTE) mismatch between the package substrate and the chip.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
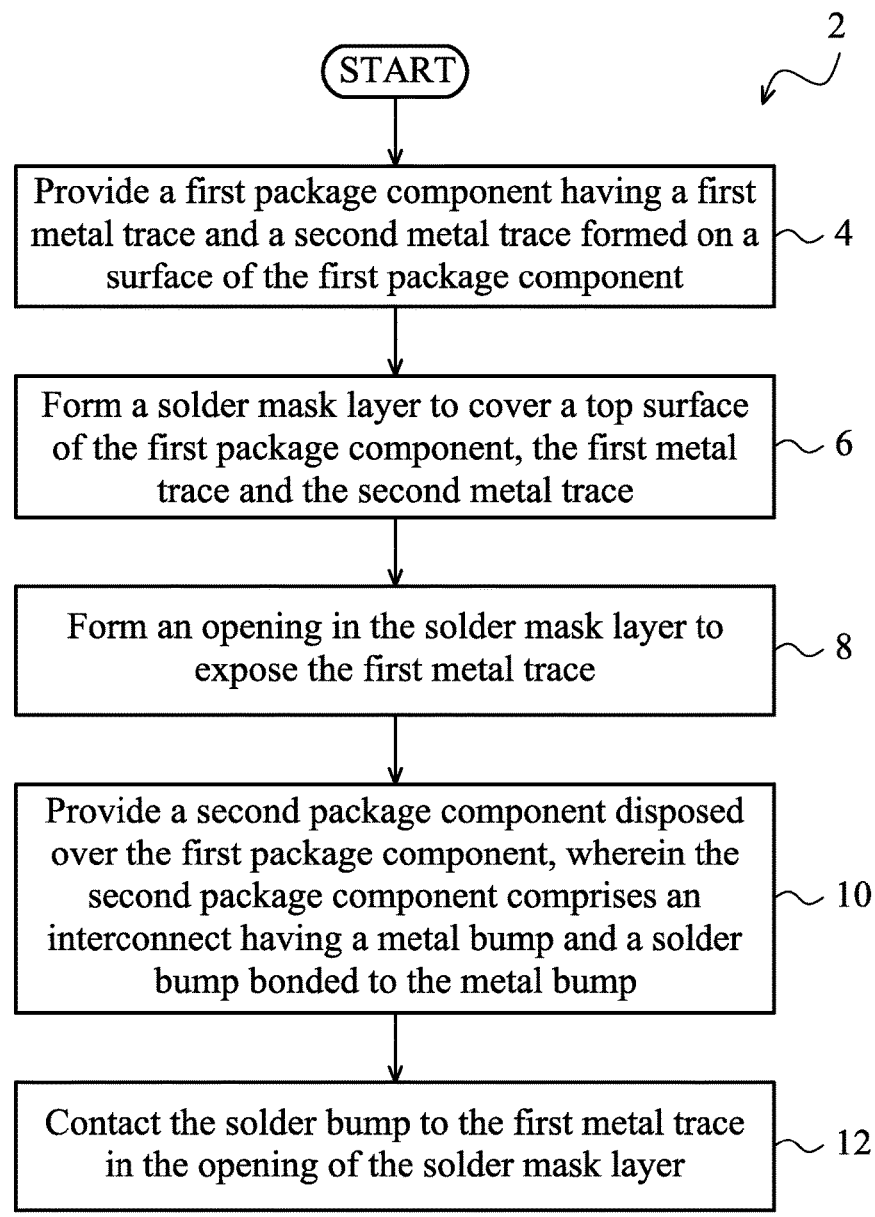
FIG. 1 is a flowchart of a method of fabricating a bump-on-trace structure according to various embodiments of the present disclosure.

FIG. 1 is a flowchart of a method 2 for fabricating a bump-on-trace structure according to various aspects of the present disclosure. Referring to FIG. 1, the method 2 includes block 4, in which a first package component is provided. The first package component has a first metal trace and a second metal trace formed on a surface of the first package component. The method 2 includes block 6, in which a solder mask layer is formed over the first package component to cover a top surface thereof, the first metal trace, and the second metal trace. The method 2 includes block 8, in which an opening is formed in the solder mask layer to expose the first metal trace. The method 2 includes block 10, in which a second package component is provided. The second package component is disposed over the first package component, the second package component comprising an interconnect having a metal bump and a solder bump bonded to the metal bump. The method 2 includes block 12, in which the solder bump is contacted to the first metal trace in the opening of the solder mask layer.

It is understood that additional processes may be performed before, during, or after the blocks 4-12 shown in FIG. 1 to complete the fabrication of the bump-on-trace structure, but these additional processes are not discussed herein in detail for the sake of simplicity.

FIGS. 2-5 are cross-sectional side views of a portion of a bump-on-trace package structure at various stages of fabrication in accordance with various embodiments of the method 2 of FIG. 1. One of ordinary skill would understand that FIGS. 2-5 have been simplified for a better understanding of the inventive concepts of the present disclosure.

Figure 2:
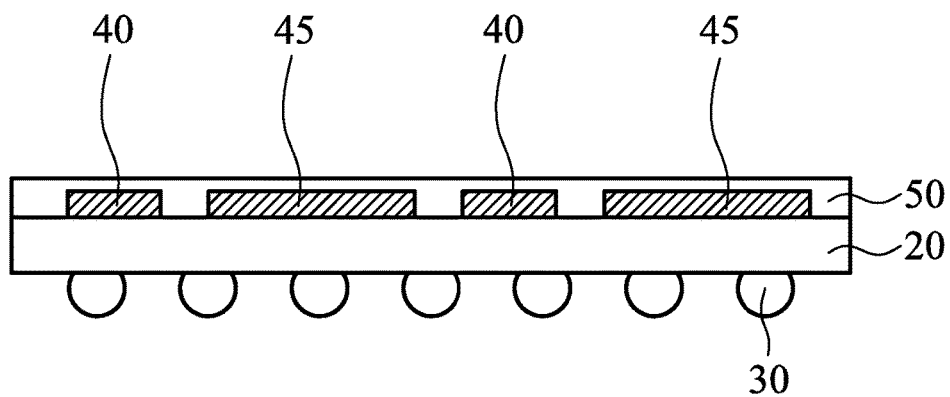
FIGS. 2-5 are cross-sectional side views of a portion of a bump-on-trace structure at various stages of fabrication in accordance with various embodiments of the present disclosure.

FIG. 2 is a cross-sectional view of a bump-on-trace package structure according to one embodiment of the present disclosure. The bump-on-trace package structure includes a first package component 20. First package component 20 may be a package substrate, and hence is alternatively referred to as package substrate 20 hereinafter. Alternatively, first package component 20 may be a semiconductor substrate such as a silicon substrate, although it may include other semiconductor materials, a wafer, an interposer, or other type of package component. A plurality of balls 30 attached to a bottom surface of the package substrate 20 may form a ball grid array (BGA) for connection to another package component.

Metal traces 40 are formed on a surface of package substrate 20. Metal traces 40 may be for expanding the footprint of a die. The width or diameter of the trace may be about the same as a solder ball (or solder bump) diameter, or can be as much as two to four times narrower than the solder ball (or solder bump) diameter. For example, metal trace 40 may have a line width between about 10 µm and 40 µm and trace pitch P between about 30 µm and 70 µm. The metal trace 40 may have a tapered shape and be in the shape of a straight line, a bent line, or a curved line. A terminal of metal trace 40 may be of a different shape from the body of the metal trace. The metal trace body may be of a substantially constant thickness. Metal trace 40 may have a substantially longer length than the diameter of a solder ball (or solder bump). FIG. 2 also shows neighboring metal traces 45 formed next to or adjacent to metal trace 40. The space between metal trace 40 and neighboring metal trace 45 may be between about 10 µm and 40 µm. There may be multiple metal traces 40 and 45 on package substrate 20.

Metal traces 40 and 45 may comprise conductive materials such as copper, copper alloy, aluminum, aluminum alloy, or other conductive materials such as tungsten, tungsten, nickel, palladium, gold, metal silicides, and/or alloys thereof.

A solder flux (not shown) may be applied to metal traces 40 and 45. The flux serves primarily to aid the flow of solder, such that a later formed solder bump (or solder ball) makes electrical contact with the metal traces 40 on the package substrate sufficient to reliably conduct electricity between the metal trace and the solder bump. The solder flux may be applied in any of a variety of methods, including brushing or spraying.

Still referring to FIG. 2, the bump-on-trace package structure includes a dielectric mask layer 50 that is formed on a top surface of the package substrate 20, the metal trace 40 and neighboring metal trace 45. Dielectric mask layer 50 may be a solder mask layer, and hence is alternatively referred to as solder mask layer 50 hereinafter. Solder mask layer 50 may perform several functions, including providing electrical insulation between the metal traces on the substrate, chemical and corrosion resistance or protection, mechanical support for the bump-on-trace structures, and improved dielectric reliability. As will be explained below, solder mask layer 50 also prevents solder bumps 90 (shown in FIG. 4) from bridging to a neighboring metal trace 45 that may be the result of a metal bump shift or a mismatch in the coefficient of thermal expansion (CTE) between the package substrate 20 and another package component such as device die 70 (See FIG. 4), for example.

Solder mask layer 50 may be formed at a single step, by screening a wet film onto the surface of package substrate 20 and then curing the wet film by oven baking. The thickness of the solder mask layer 50 may be about 30 to 40 microns (typically around 35 microns). Solder mask layer 50 may comprise a polymer, epoxy, and/or dielectric material that do not react with solder.

Figure 3:
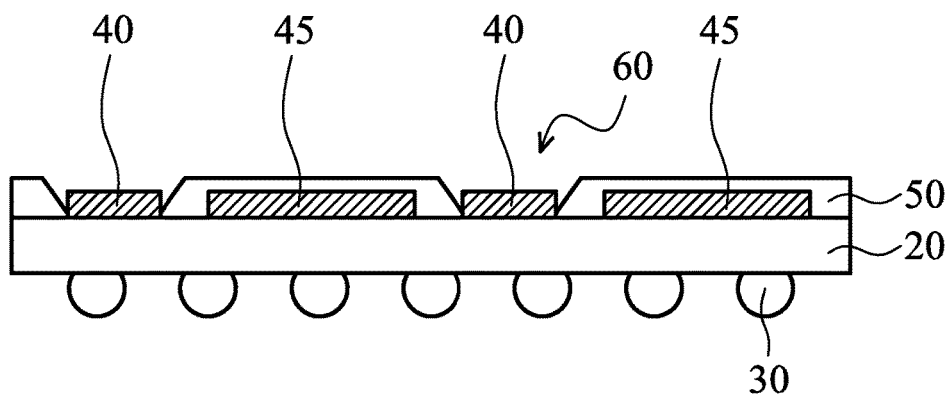
Figure 4:
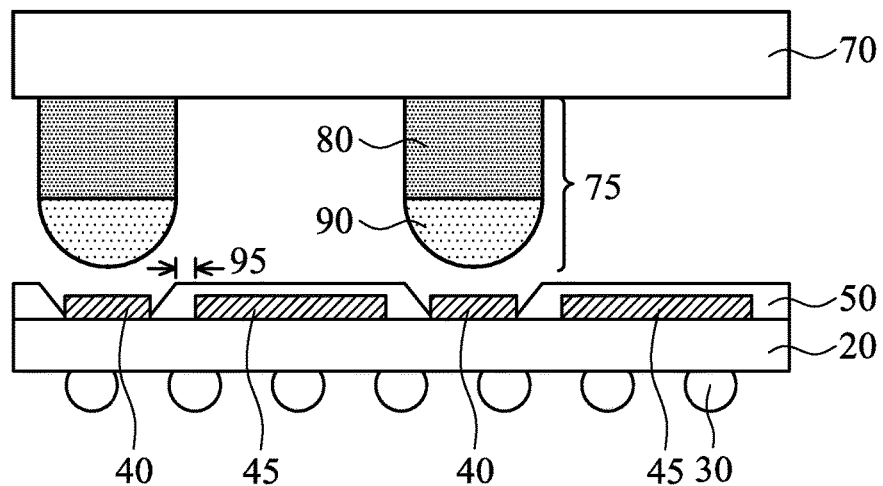

Openings may be formed in the solder mask layer to expose select metal traces for bonding to an interconnect such as solder bumps 90 (see FIG. 4). According to one embodiment as shown in FIG. 3, openings 60 are formed in the solder mask layer 50 to expose metal traces 40 but neighboring metal traces 45 are not exposed. It is understood that any number and/or combination of openings can be formed in the solder mask layer through which respective metal traces are exposed. In one embodiment, solder mask layer 50 is constructed of a photodefinable material, and is patterned by photoresist patterning techniques to form openings 60. In some embodiments, openings 60 are formed by laser drilling the solder mask layer 50. Opening 60 may be large enough so that an interconnect such as solder bump 90 may directly land on metal trace 40 contained in the opening. For example, opening 60 has a size substantially equal to a diameter of a solder bump 90. A wider opening to host solder bump 90 can increase the connection strength between the solder bump and the trace. The size of the opening is flexible and may change with the size of the solder bump used to connect to the respective metal trace.

With reference now to FIG. 4, the bump-on-trace package structure includes a second package component 70, whereby the first package component 20 is bonded to the second package component 70 through solder bumps 90. Second package component 70 may be a device die that includes active devices therein, and hence is alternatively referred to as device die 70 hereinafter. Device die 70 may be a memory die, or any other functional die. Alternatively, first package component 20 may be a substrate, a wafer, an interposer, or other type of package component.

Device die 70 is flipped to face package substrate 20 for connection to package substrate 20 by a plurality of interconnects 75. Each of the plurality of interconnects 75 comprises a metal bump 80 and a solder bump 90, in at least one embodiment. In other embodiments, interconnects 75 comprise other connectors. Interconnects 75 may be formed in a variety of shapes, such as in the shape of a circle, an octagon, a rectangle, an elongated hexagon with two trapezoids on opposite ends of the elongated hexagon, an oval, a diamond, or the like.

Metal bump 80 may comprise a copper pillar bump. However, the pillar bump material should not be limited to copper only. Examples of other materials suitable for the metal bump 80 include aluminum, aluminum/silicon/copper alloy, titanium, titanium nitride, tungsten, polysilicon, metal silicide (such as nickel silicide, cobalt silicide, tungsten silicide, tantalum silicide, titanium silicide, platinum silicide, palladium silicide, or combinations thereof), copper, copper alloy, titanium, titanium nitride, tantalum, tantalum nitride, tungsten, polysilicon, and combinations thereof.

Figure 5:
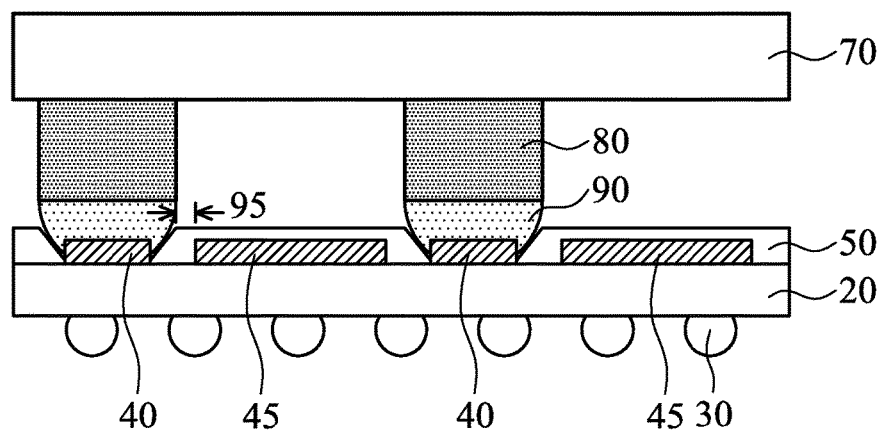

As shown in FIG. 5, metal bump 80 is positioned to overlay metal trace 40 (with a minimum bump to trace distance 95 to a side of neighboring metal trace 45) on package substrate 20, to allow solder bump 90 contacting metal trace 40 in opening 60 to form a bump-on-trace connection. In at least one embodiment, solder bump 90 may be formed on metal bump 80, for example, by plating a solder layer on top of metal bump 80, and then applying heat to reflow the solder layer. In at least one embodiment, the heat may be to a temperature of about 220 C. The solder layer may contain lead, or be lead-free. Examples of solder materials include tin, copper, silver, bismuth, indium, zinc, antimony, Sn—Ag—Cu, Ag—Cu—Zn and Sn—Ag—Cu—Mn, and alloys with traces of other metals. In at least one embodiment in which solder bump 90 is a tin solder bump, the solder bump 90 may be formed by initially forming a layer of tin through methods such as evaporation, electroplating, printing, solder transfer, or ball placement, to a thickness of, e.g., about 15 µm, and then performing a reflow in order to shape the material into a desired bump shape. Any suitable method of producing the solder bump 90 may alternatively be utilized.

Referring back to FIG. 4, a gap 95 between the metal bump 80 and the neighboring trace 45 is the minimum bump-to-trace distance sufficient to provide short circuit protection. However, solder bump bridging to a neighboring metal trace frequently happens at the minimum bump to trace location. Solder mask layer 50 confines solder bump 90 in opening 60 for contact to metal trace 40 and prevents solder bump 90 from contacting a neighboring metal trace, such as neighboring metal trace 45. Opening 60 also defines a contour of the melted solder at metal trace 40 and the solder flow is limited by the solder mask layer 50, for example by the width of the opening 60 in solder mask layer 50.

After the bonding of the device die 70 to the package substrate 20, an underfill (e.g., a thermo-set epoxy) or a mold underfill (MUF) (not shown) may be dispensed in the space between package substrate 20 and device die 70 and may contact metal traces 40 and 45. The underfill produces a mechanically, as well as electrically, bonded semiconductor chip assembly.

The bump-on-trace package structures shown in FIGS. 2-5 are only for illustrative purpose and are not limiting. Additional embodiments can be conceived.

Advantages of one or more embodiments of the present disclosure may include one or more of the following.

In one or more embodiments, the solder mask layer prevents solder bumps from bridging to a neighboring metal trace at the minimum bump to trace location that may be the result of a metal bump shift or a mismatch in the coefficient of thermal expansion (CTE) between a first package component and a second package component.

In one or more embodiments, the bump-on-trace structure reduces the risk of solder bridging.

In one or more embodiments, fine pitch metal bumps can be achieved in bump-on-trace package structures.

In one or more embodiments, the solder mask layer provides for electrical insulation between the metal traces on the substrate, chemical and corrosion resistance or protection, mechanical support for the bump-on-trace structures, and improved dielectric reliability.

The present disclosure has described various exemplary embodiments. According to one embodiment, a device includes a first package component. A first metal trace and a second metal trace are formed on a surface of the first package component. A dielectric mask layer covers a top surface of the first package component, the first metal trace and the second metal trace, wherein the dielectric mask layer has an opening therein that exposes the first metal trace. The device further includes a second package component and an interconnect formed on the second package component. The interconnect includes a metal bump and a solder bump, the solder bump is formed on the metal bump. The solder bump contacts the first metal trace in the opening of the dielectric mask layer.

According to another embodiment, a bump-on-trace package structure includes a first package component. A first metal trace and a second metal trace are formed on a surface of the first package component. A solder mask layer covers a top surface of the first package component, the first metal trace and the second metal trace, wherein the solder mask layer has an opening therein exposing the first metal trace. The bump-on-trace package structure further includes a second package component disposed over the first package component. The second package component includes an interconnect having a copper pillar bump and a solder bump, the solder bump bonded to the copper pillar bump. The solder bump contacts the first metal trace in the opening of the dielectric mask layer.

According to yet another embodiment, a method for manufacturing a device, includes providing a first package component having a first metal trace and a second metal trace formed on a surface of the first package component. A solder mask layer is formed to cover a top surface of the first package component, the first metal trace and the second metal trace. An opening is formed in the solder mask layer to expose the first metal trace. A second package component is disposed over the first package component, wherein the second package component includes an interconnect having a metal bump and a solder bump, the solder bump bonded to the metal bump. The solder bump is contacted to the first metal trace in the opening of the solder mask layer.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A device comprising:
   a first package component;
   a first metal trace and a second metal trace on a top surface of the first package component, the first metal trace having a first thickness with respect to the top surface of the first package component and the second metal trace having a second thickness with respect to the top surface of the first package component, the first thickness and the second thickness being substantially equal;
   a dielectric mask layer covering a top surface of the first package component and the second metal trace, wherein the dielectric mask layer has an opening therein exposing the first metal trace in a cross sectional view, the dielectric mask layer not exposing the second metal trace in the cross sectional view, wherein a first side surface of the second metal trace forms a first interface with the dielectric mask layer in the cross sectional view, wherein a second side surface of the second metal trace opposite the first side surface forms a second interface with the dielectric mask layer in the cross sectional view, the first interface and the second interface each extending continuously from a topmost surface of the second metal trace to a bottommost surface of the second metal trace, and the dielectric mask layer has constantly sloped sidewall surfaces defining the opening, the dielectric mask layer being a photodefinable layer;
   a second package component; and
   an interconnect formed on the second package component, the interconnect having a metal bump and a solder bump formed on the metal bump, the solder bump being in contact with a top surface and a side surface of the first metal trace in the opening of the dielectric mask layer, the constantly sloped sidewall surfaces of the dielectric mask layer being in contact with the side surface of the first metal trace at a first point, the solder bump being in contact with the side surface of the first metal trace at a second point, the first point being higher than the second point, an entirety of the side surface of the first metal trace being perpendicular to the top surface of the first metal trace, the side surface of the first metal trace extending continuously from a topmost surface of the first metal trace to a bottommost surface of the first metal trace, a continuous portion of the side surface of the first metal trace extending continuously from the first point to the second point being not in contact with the dielectric mask layer and not in contact with the solder bump, the second point being above a bottommost surface of the first metal trace.

2. The device of claim 1, wherein the first package component comprises a package substrate and the second package component comprises a device die.

3. The device of claim 1, wherein the second metal trace is adjacent to the first metal trace.

4. The device of claim 3, wherein the second metal trace is substantially parallel to the first metal trace.

5. The device of claim 3, wherein the first metal trace has a shape selected from the group consisting of a straight line, a bent line, and a curved line.

6. The device of claim 1, wherein the dielectric mask layer comprises a material selected from the group consisting of polymer, epoxy, dielectric, and combinations thereof.

7. The device of claim 1, wherein the metal bump comprises a copper pillar bump.

8. The device of claim 1, further comprising an underfill in a space between the first package component and the second package component.

9. A bump-on-trace package structure comprising:
a first package component;
a first metal trace and a second metal trace formed on a top surface of the first package component, the first metal trace having a first thickness with respect to the top surface of the first package component and the second metal trace having a second thickness with respect to the top surface of the first package component, the first thickness and the second thickness being substantially equal;
a solder mask layer covering the top surface of the first package component and the second metal trace, wherein the solder mask layer has an opening therein exposing the first metal trace and the solder mask layer has constantly sloped sidewalls defining the opening, the solder mask layer being a photodefinable layer, the constantly sloped sidewalls of the solder mask layer contacts a side surface of the first metal trace at a first point; and
a second package component disposed over the first package component, and wherein the second package component comprises an interconnect having a copper pillar bump and a solder bump bonded to the copper pillar bump, the solder bump being in contact with a top surface and the side surface of the first metal trace in the opening of the solder mask layer but not the second metal trace, the solder bump further being in contact with the side surface of the first metal trace at a second point, at least a portion the side surface of the first metal trace extending continuously from the first point to the second point being orthogonal to the top surface of the first package component.

10. The bump-on-trace package structure of claim 9, wherein the first package component comprises a package substrate and the second package component comprises a device die.

11. The bump-on-trace package structure of claim 9, wherein the second metal trace is adjacent to the first metal trace.

12. The bump-on-trace package structure of claim 11, wherein the second metal trace is substantially parallel to the first metal trace and the first metal trace has a shape selected from the group consisting of a straight line, a bent line, and a curved line.

13. The bump-on-trace package structure of claim 9, wherein the solder mask layer comprises a material selected from the group consisting of polymer, epoxy, dielectric, and combinations thereof.

14. A device comprising:
a first package component;
a first metal trace and a second metal trace on a top surface of the first package component, the first metal trace having a first thickness with respect to the top surface of the first package component and the second metal trace having a second thickness with respect to the top surface of the first package component, the first thickness and the second thickness being substantially equal;
a dielectric mask layer covering a top surface of the first package component and the second metal trace, wherein the dielectric mask layer has an opening therein exposing the first metal trace but not the second metal trace, and the dielectric mask layer has constantly sloped sidewall surfaces defining the opening, the dielectric mask layer being a photodefinable layer, the dielectric mask layer forming a first interface with a side surface of the first metal trace;
a second package component; and
an interconnect formed on the second package component, the interconnect having a metal bump and a solder bump formed on the metal bump, the solder bump being in contact with a top surface and the side surface of the first metal trace in the opening of the dielectric mask layer, the solder bump forming a second interface with the side surface of the first metal trace, the side surface of the first metal trace extending continuously from the first interface to the second interface.

15. The device of claim 14, wherein the opening in the dielectric mask layer has a diameter greater than or equal to a diameter of the solder bump.

16. The device of claim 1, wherein the first metal trace is separated from the second metal trace by a space from about 10 micrometers to about 40 micrometers, and the constantly sloped sidewall surface of the dielectric mask layer is sloped at an angle with respect to the top surface of the first package component such that the dielectric mask layer is configured to preserve a minimum spacing between the solder bump and the second metal trace.

17. The device of claim 16, wherein the dielectric mask layer has a third thickness with respect to the top surface of the first package component, and the third thickness is greater than the first thickness and greater than the second thickness.

18. The device of claim 1, wherein more than half of the side surface of the first metal trace is exposed in the opening of the dielectric mask layer, the side surface of the first metal trace that is more than half exposed in the opening being orthogonal to the top surface of the first package component.

19. The device of claim 14, wherein a portion of the side surface of the first metal trace between the first interface and the second interface being not in contact with the dielectric mask layer and not in contact with the solder bump.

* * * * *